United States Patent
Schmidt

(10) Patent No.: US 12,205,884 B2
(45) Date of Patent: Jan. 21, 2025

(54) METHOD TO CREATE MIMCAP DESIGNS ACROSS CHANGING MIMCAP STRUCTURES

(71) Applicant: Advanced Micro Devices, Inc., Santa Clara, CA (US)

(72) Inventor: Regina Tien Schmidt, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 132 days.

(21) Appl. No.: 17/563,693

(22) Filed: Dec. 28, 2021

(65) Prior Publication Data

US 2023/0207447 A1 Jun. 29, 2023

(51) Int. Cl.
| | | |
|---|---|---|
| *H01L 23/522* | (2006.01) | |
| *H01L 21/768* | (2006.01) | |
| *H01L 27/08* | (2006.01) | |
| *H01L 49/02* | (2006.01) | |
| *H10B 12/00* | (2023.01) | |

(52) U.S. Cl.
CPC .... *H01L 23/5223* (2013.01); *H01L 21/76801* (2013.01); *H01L 23/5226* (2013.01); *H01L 27/0805* (2013.01); *H01L 28/60* (2013.01); *H10B 12/033* (2023.02); *H01L 21/76805* (2013.01); *H01L 2224/0401* (2013.01)

(58) Field of Classification Search
CPC ........... H01L 23/5223; H01L 21/76801; H01L 23/5226; H01L 27/0805; H01L 28/60; H01L 23/522; H01L 2224/0401; H01L 21/76805; H10B 12/033
See application file for complete search history.

(56) References Cited

U.S. PATENT DOCUMENTS

| | | |
|---|---|---|
| 9,129,817 B2 | 9/2015 | Elsherbini et al. |
| 10,608,076 B2 | 3/2020 | Schultz |
| 10,756,164 B2 | 8/2020 | Schultz |
| 2013/0264681 A1 | 10/2013 | Tu et al. |
| 2013/0270675 A1* | 10/2013 | Childs ............... H01L 28/60 257/532 |
| 2018/0277624 A1* | 9/2018 | Schultz ............... H01L 28/84 |

(Continued)

*Primary Examiner* — Patricia D Valenzuela
(74) *Attorney, Agent, or Firm* — Kowert, Hood, Munyon, Rankin & Goetzel, P.C.; Rory D. Rankin

(57) ABSTRACT

A system and method for fabricating on-die metal-insulator-metal capacitors capable of maintaining a similar capacitance for design reuse across multiple semiconductor fabrication processes are described. In various implementations, an integrated circuit includes multiple metal-insulator-metal (MIM) capacitors. The MIM capacitors are formed between two signal nets. The integrated circuit includes multiple intermediate metal layers (or metal plates) formed between two signal nets. Subsequent semiconductor fabrication processes typically increase a number of metal plates that can be formed in the dielectric layer, such as an oxide layer, between two signal nets. To permit design reuse across multiple semiconductor fabrication processes, for a particular MIM capacitor designated to maintain a same capacitance, the additional metal plates for the particular MIM capacitor are formed as floating nets. Additionally, the same electrode plates of the particular MIM capacitor are used across the multiple semiconductor fabrication processes.

13 Claims, 7 Drawing Sheets

(56) References Cited

U.S. PATENT DOCUMENTS

| | | |
|---|---|---|
| 2019/0279899 A1 | 9/2019 | Maruthamuthu et al. |
| 2020/0020644 A1 | 1/2020 | Lee et al. |
| 2021/0343650 A1 | 11/2021 | Peng et al. |

* cited by examiner

METHOD TO CREATE MIMCAP DESIGNS ACROSS CHANGING MIMCAP STRUCTURES

BACKGROUND

Description of the Relevant Art

As both semiconductor manufacturing processes advance and on-die geometric dimensions reduce, semiconductor chips provide more functionality and performance while consuming less space. While many advances have been made, design issues still arise with modern techniques in processing and integrated circuit design that limit potential benefits. For example, as the number and size of passive components used in a design increase, the area consumed by these components also increases. Impedance matching circuits, harmonic filters, decoupling capacitors, bypass capacitors and so on are examples of these components.

Many manufacturing processes use on-die metal-insulator-metal (MIM) capacitors to provide capacitance in both on-die integrated circuits and off-chip integrated passive device (IPD) packages. A MIM capacitor is formed with two parallel metal plates separated by a dielectric layer. Generally speaking, each of the two metal plates and the dielectric layer is parallel to a semiconductor substrate surface. Such MIM capacitors are used in a variety of integrated circuits, including oscillators and phase-shift networks in radio frequency (RF) integrated circuits, as decoupling capacitors to reduce noise in both mixed signal integrated circuits and microprocessors as well as bypass capacitors near active devices in microprocessors to limit the parasitic inductance, and so on. MIM capacitors are also used as memory cells in a dynamic RAM.

Fabricating MIM capacitors is a challenging process. The material selection for the dielectric layer is limited as many of the materials used for the dielectric layer are able to diffuse with the metal layers used for the parallel metal plates. This limited selection can also reduce the capacitance per area that might otherwise be achieved. Further, the on-die region of the integrating circuit using the MIM capacitor can include additional metal plates as the semiconductor fabrication process progresses. For example, a same design already in production is fabricated with a new process that uses additional metal plates. One or more of the MIM capacitors can change its capacitance value, which can render the corresponding circuitry unsatisfactory for its intended purpose when the original capacitance value should remain.

In view of the above, efficient methods and systems for fabricating on-die metal-insulator-metal capacitors capable of maintaining a similar capacitance for design reuse across multiple semiconductor fabrication processes are desired.

Figure 1:
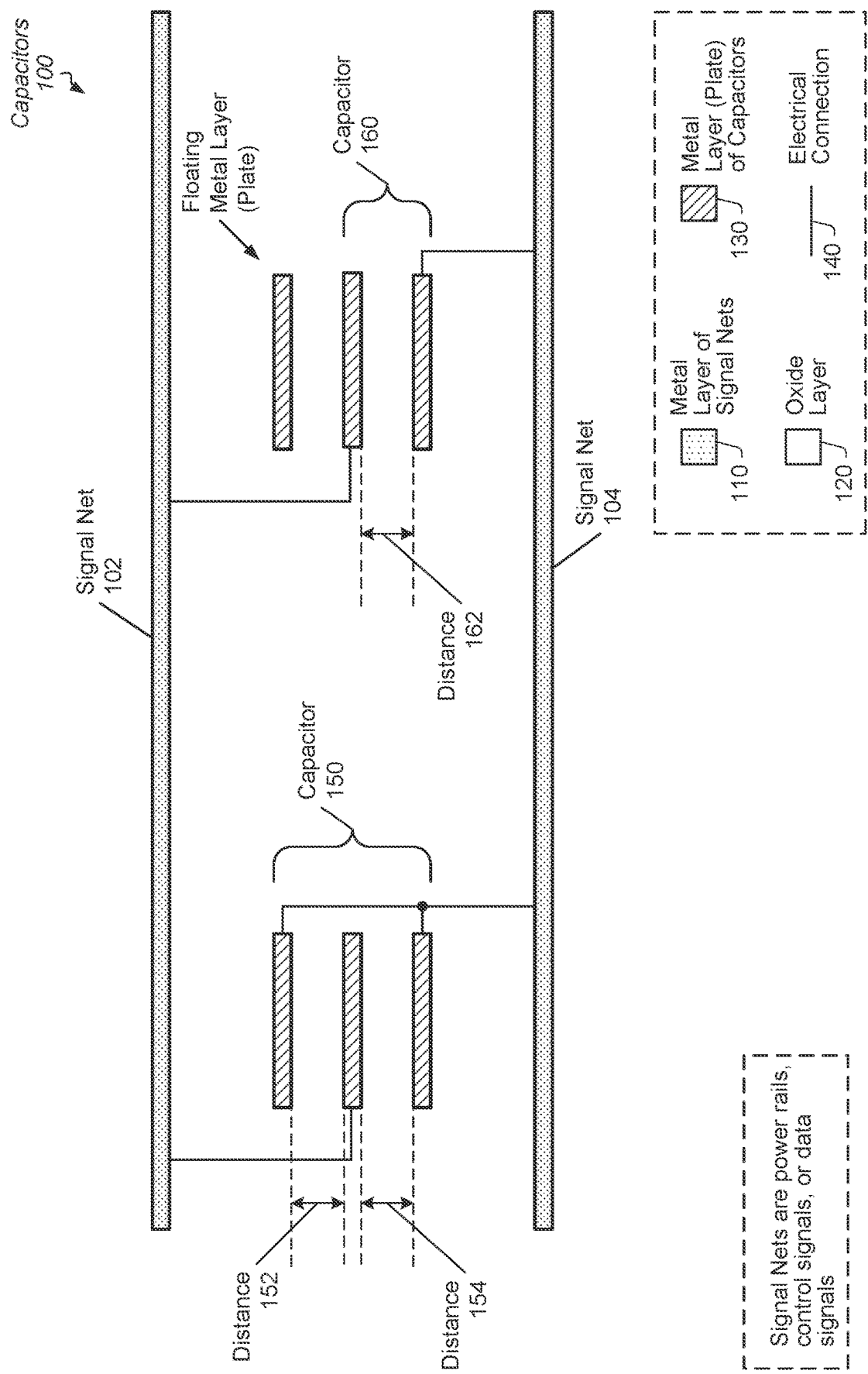
FIG. 1 is a generalized diagram of capacitors capable of maintaining a similar capacitance for design reuse across multiple semiconductor fabrication processes.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for fabricating on-die metal-insulator-metal capacitors capable of maintaining a similar capacitance for design reuse across multiple semiconductor fabrication processes are contemplated. In various implementations, an integrated circuit includes multiple metal-insulator-metal (MIM) capacitors used in one or more of a variety of types of circuits. Typically, an on-die capacitor is formed between two signal nets. In some implementations, the two signal nets are power rails charged to two different voltage levels. For example, a first signal net (or first power rail) is charged to a power supply reference voltage level, and a second signal net (or second power rail) is charged to a ground reference voltage level. In other implementations, the two signal nets are two different control signals or two different data signals used by the on-die integrated circuit.

One or more insulating dielectric layers are formed between the two metal layers used for the first signal net and the second signal net. These one or more insulating dielectric layers include at least one inter-level dielectric (ILD) layer. The semiconductor fabrication process used to create the integrated circuit also supports forming multiple intermediate metal layers in the ILD between the two signal nets. These intermediate metal layers are used to form capacitor plates. The maximum number of plates formed between the two signal nets is based on the semiconductor fabrication process used to create the integrated circuit. For example, the semiconductor fabrication process is capable of supporting three, four, or five intermediate metal layers between two signal nets. Another number of intermediate metal layers is possible and contemplated.

For a significant number of design requirements, a larger capacitance improves circuit behavior. The use of a decoupling capacitor is one example. Subsequent semiconductor fabrication processes typically increase a number of metal plates that can be formed in the dielectric layer, such as an oxide layer, between two signal nets. The additional metal plates allow a particular MIM capacitor to have more electrode plates that provide additional capacitances in a parallel configuration. Therefore, the capacitance of the MIM capacitor increases. However, for other MIM capacitors, no change in capacitance is preferred. To permit design reuse across multiple semiconductor fabrication processes, for a particular MIM capacitor designated to maintain a same capacitance, the additional metal plates for the particular MIM capacitor are formed as floating nets. The floating metal plates have no connection to any power supply reference voltage level of the integrated circuit.

In addition, the same electrode plates of the particular MIM capacitor are used across the multiple semiconductor fabrication processes. For example, if the two metal plates adjacent to a first signal net are used as the electrode plates of the particular MIM capacitor, then these same two metal plates are used as the electrode plates across the multiple semiconductor fabrication processes. In one example, a subsequent semiconductor fabrication process adds two more metal plates, which are both between the first signal net and the second adjacent net as well as adjacent to the second signal net. The particular MIM capacitor still uses the two metal plates adjacent to the first signal net as the electrode plates, and the two additional metal plates are formed as floating nets. Therefore, the design for the particular MIM capacitor is not redrawn, no additional masks are required, no delay in a design schedule is added, and design cost reduces compared to redesigning the particular MIM capacitor. Should the particular MIM capacitor use different metal plates, then other circuitry connected to the particular MIM capacitor is changed to account for the change in capacitance of the particular MIM capacitor. When forming each additional metal plate as a floating net, any redesign is avoided.

Turning now to FIG. 1, a generalized block diagram is shown of capacitors 100 of an integrated circuit capable of maintaining a similar capacitance for design reuse across multiple semiconductor fabrication processes. A semiconductor fabrication process forms multiple intermediate metal layers (or metal plates) using metal layer 130 between two signal nets 102 and 104. The semiconductor fabrication process uses metal plates to form the metal-insulator-metal (MIM) capacitors 150 and 160 between the two signal nets 102 and 104. The semiconductor fabrication process (or process) forms the MIM capacitors 150 and 160 in the oxide layer 120 between the two signal nets 102 and 104. The process forms an electrical connection 140 between a particular metal plate and one of the two signal nets 102 and 104. The electrical connections 140 include one of a variety of types of vias. The MIM capacitor 160 (or capacitor 160) includes a floating metal plate as the top plate, or the plate located closest to the signal net 102. The floating plate has no connection to any power supply reference voltage level used by the integrated circuit. In contrast, the MIM capacitor 150 (or capacitor 150) has no floating nets.

The middle metal plate of capacitor 150 is an electrode metal plate connected to the signal net 102. Both of the top and bottom metal plates of capacitor 150 form the other electrode plates, which are connected to the signal net 104. The equivalent capacitance of capacitor 150 is a sum of the capacitances of the first capacitance that uses the insulating distance 152 and the second capacitance that uses the insulating distance 154. These two capacitances of the capacitor 150 are connected in a parallel configuration. The first capacitance includes the ratio of the overlap area of the top metal plate and the middle metal plate to the insulating distance 152. The dielectric constant of the dielectric material, such as oxide layer 120, between the two metal plates also affects the capacitance. Similarly, the second capacitance includes the ratio of the overlap area of the middle metal plate and the bottom metal plate to the insulating distance 154. The dielectric constant of the dielectric material, such as oxide layer 120, between the two metal plates also affects the capacitance.

For the capacitor 160, the top metal plate is a floating plate and the middle metal plate is an electrode metal plate connected to the signal net 102. The bottom metal plate of capacitor 160 forms the other electrode plate, which is connected to the signal net 104. The capacitance of capacitor 160 includes the ratio of the overlap area of the middle metal plate and the bottom metal plate to the insulating distance 162. Similar to the capacitor 150, the dielectric constant of the dielectric material, such as oxide layer 120, between the two metal plates also affects the capacitance. Although the capacitors 150 and 160 are shown relatively close to one another, it is possible that these capacitors are in different regions of the integrated circuit that use the signal nets 102 and 104. In other implementations, the capacitors 150 and 160 do not share the signal nets 102 and 104. The capacitors 150 and 160 are shown sharing the signal nets 102 and 104 for ease of illustration.

In an example, the capacitor 150 is used as a decoupling capacitor, so an increase in the equivalent capacitance across different semiconductor fabrication processes is tolerated and improves circuit behavior. However, the capacitor 160 is used in a tuning circuit and the capacitance should remain at a similar value across the different semiconductor fabrication processes. Otherwise, other circuits that are affected by the capacitor 160 should be redesigned to achieve the same performance or the same circuit behavior. Therefore, as the number of metal plates between the signal nets 102 and 104 increase across different semiconductor fabrication processes, the capacitor 150 uses the additional metal plates as electrode plates.

In one example, in a previous semiconductor fabrication process (or process) that used two metal plates, the capacitor 150 had only the bottom metal plate connected to the signal net 104, and its equivalent capacitance was half of what is shown in capacitors 100. When a third metal plate is made available, as shown in the illustrated implementation, this third metal plate, which is the top metal plate, is also connected to the signal net 104. This connection increases the equivalent capacitance of capacitor 150. In contrast, the additional third metal plate made available to capacitor 160 is formed as a floating net. The capacitance of the capacitor 160 remains relatively the same in both processes whether two metal plates are used or three metal plates are used. Therefore, the design for the capacitor 160 is not redrawn, no additional masks are required for the capacitor 160, no delay in a design schedule is added, and design cost reduces compared to redesigning the capacitor 160. Since the capacitance is relatively the same across processes, circuitry that is affected by the capacitor 160 is also not redesigned.

Figure 6:
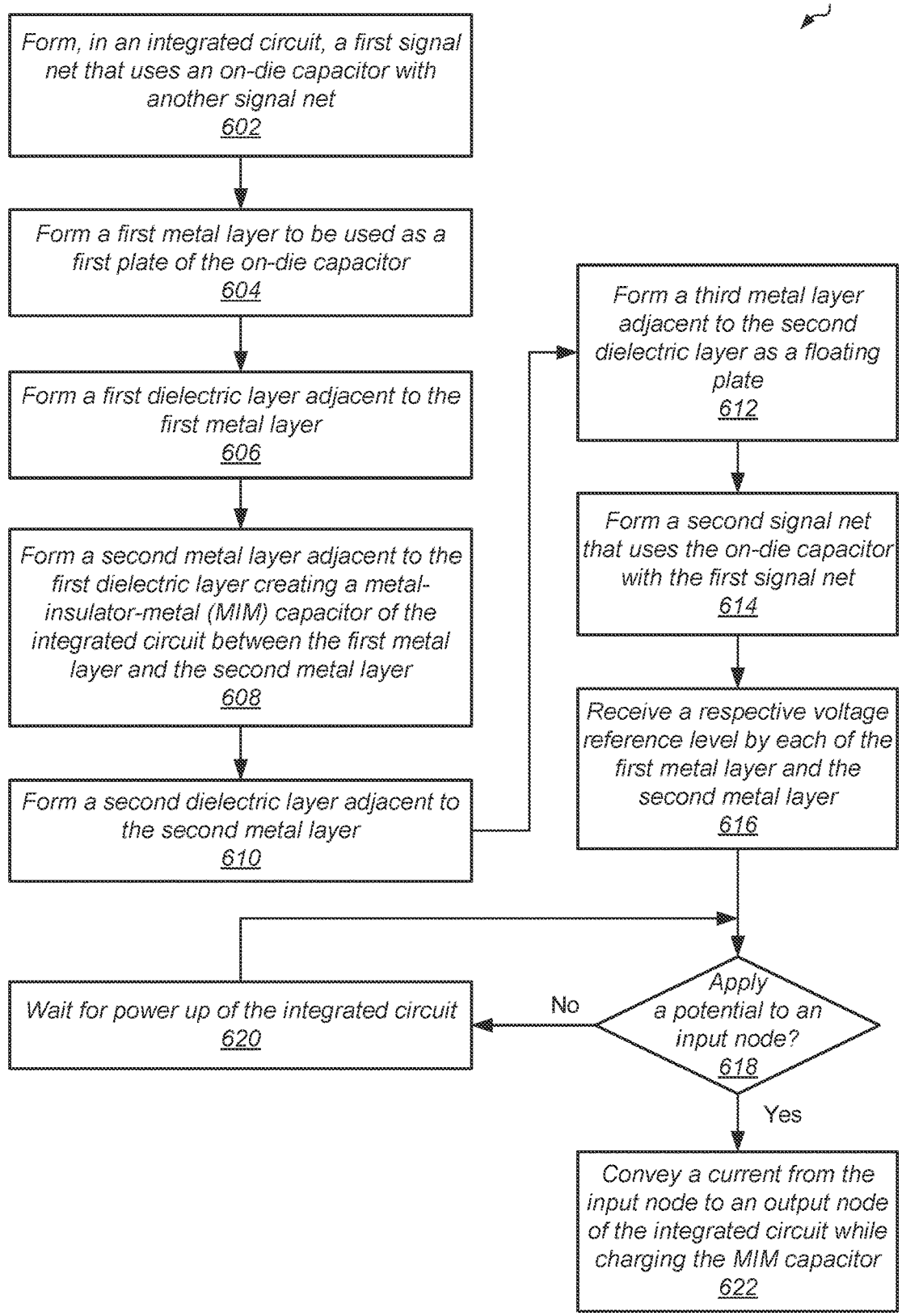
FIG. 6 is a generalized diagram of a method for forming capacitors capable of maintaining a similar capacitance for design reuse across multiple semiconductor fabrication processes.

Further details of the semiconductor fabrication processing steps used to create the capacitors 150 and 160 are provided in a description of method 600 (of FIG. 6). However, a brief description is provided in the following discussion. In an implementation, the two signal nets 102 and 104 have static voltage levels over time, whereas, in another implementation, the two signal nets 102 and 104 have dynamic voltage levels over time. In some implementations, the two signal nets 102 and 104 are power rails charged to two different voltage levels. In one example, the signal net 102 is charged to a power supply reference voltage level, and the second signal net 104 is charged to a ground reference voltage level. In other implementations, the two signal nets 102 and 104 are two different control signals used by the integrated circuit. In yet other implementations, the two signal nets 102 and 104 are two different data signals used by the integrated circuit.

In one example, the signal net 102 is one signal route using a metal five (Metal 5, or M5) layer and the signal net 104 is signal route using a metal four (Metal 4, or M4) layer. For example, a metal zero (Metal 0, or M0) layer of the semiconductor fabrication process is the lowest metal layer formed above a gate region of a transistor. A metal one (Metal 1, or M1) layer is formed above the metal zero layer, and so on. In some designs, each of the signal nets 102 and 104 use a same conductive material such as metal layer 110. The metal layer 110 uses one of a variety of conductive materials such as copper, a mixture of copper and aluminum, or other. In other designs, the signal net 102 uses a different conductive material than what is used for signal net 104.

Although a single oxide layer 120 is shown as formed between the two metal layers used for the signal net 102 and the signal net 104, in some implementations, the process forms one or more insulating dielectric layers. These one or more insulating dielectric layers include at least one inter-level dielectric (ILD) layer. Each of the insulating dielectric layers has a particular dielectric constant and a particular thickness. Thicknesses of metal layers and dielectric layers are measured in the vertical direction when using the orientation shown in FIG. 1. For example, the distances 152, 154 and 162 are also referred to as the thicknesses 152, 154 and 162. Using this orientation, the widths of the metal layers 110 and 130 are measured in a direction going into the diagram, whereas, the lengths of the metal layers 110 and 130 are measured in the horizontal direction.

The process forms multiple intermediate metal plates that use the metal layer 130 between the two signal nets 102 and 104. The maximum number of metal plates formed between the signal nets 102 and 104 is based on the semiconductor fabrication process used to create the integrated circuit. For example, the semiconductor fabrication process is capable of supporting three, four, or five intermediate metal plates between the signal nets 102 and 104. Another number of intermediate metal plates is also possible and contemplated. In some designs, each of the metal plates uses a same conductive material such as metal layer 130. In an implementation, the metal layer 130 is one of tantalum nitride (TaN) and titanium nitride (TiN) in contrast to copper or a copper and aluminum mixture. In other implementations, the metal layer 130 uses copper, a mixture of copper and aluminum, or other. In other designs, one or more of the metal plates use a different conductive material than what is used for other metal plates between the signal nets 102 and 104. Similarly, in some designs, each of the metal plates uses a same thickness, whereas, in other designs, one or more of the metal plates use a different thickness than what is used for other metal plates.

To increase yield and increase rigidity of the dies of the wafers, in some implementations, the process creates the same maximum number of metal plates in regions. In some designs, the maximum number of metal plates is three as shown in capacitors 100. The capacitor 150 uses each of the three available metal plates. The capacitor 160 uses only two of the three available metal plates. In other designs, the process supports skipping the forming of unused metal plates. The capacitor 160 uses two metal plates by skipping the top metal plate.

Figure 2:
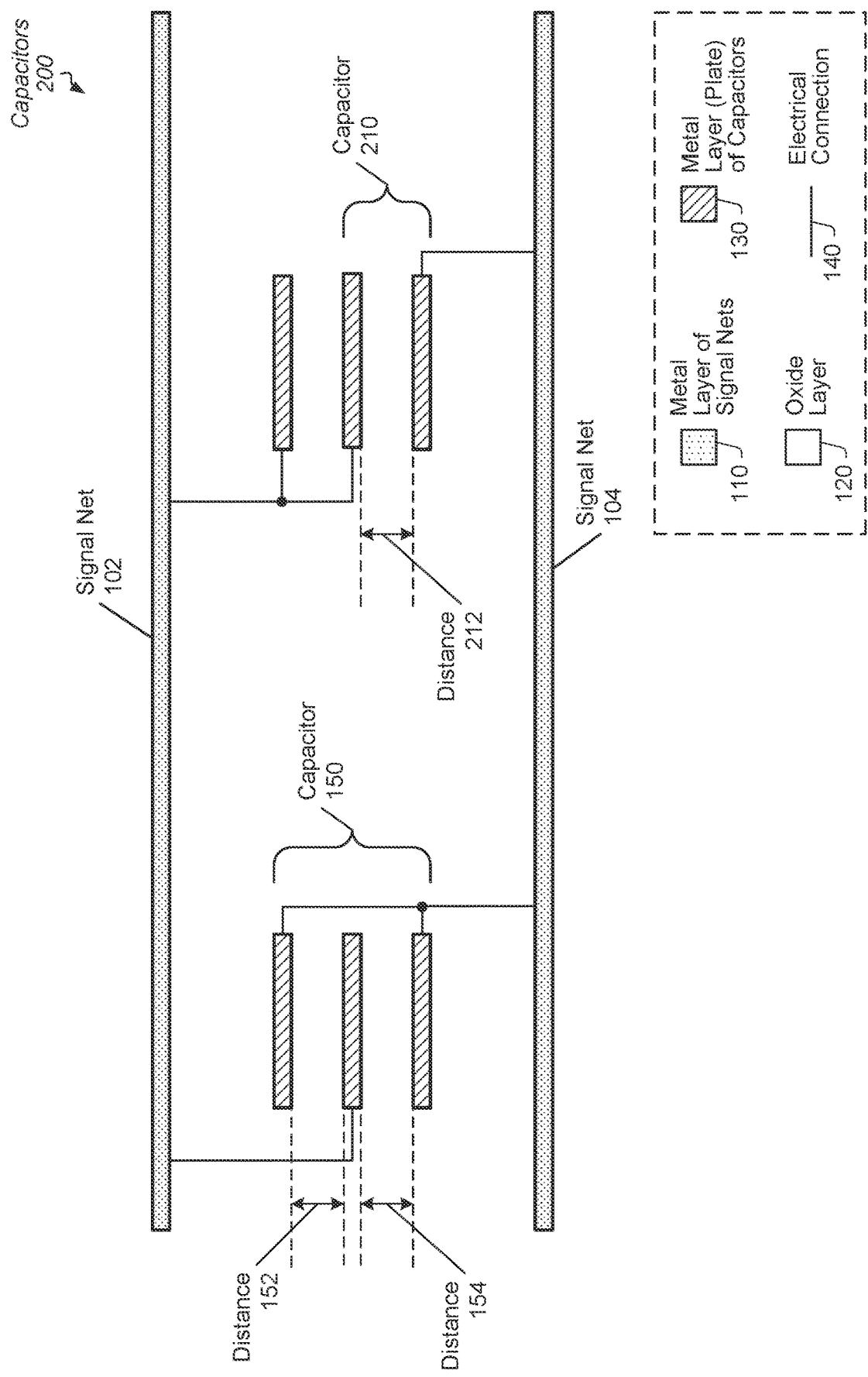
FIG. 2 is a generalized diagram of capacitors capable of maintaining a similar capacitance for design reuse across multiple semiconductor fabrication processes.

Turning now to FIG. 2, a generalized block diagram is shown of capacitors 200 of an integrated circuit capable of maintaining a similar capacitance for design reuse across multiple semiconductor fabrication processes. Signals and materials described earlier are numbered identically. The capacitors 200 includes the capacitor 150 and the capacitor 210. Similar to the capacitor 150, the capacitor 210 includes three metal plates between the two signal nets 102 and 104. The capacitor 210 uses each of the three metal plates as electrode metal plates. The top and middle metal plates of the capacitor 210 are connected to the signal net 102. The bottom metal plate of capacitor 210 is connected to the signal net 104.

In some designs, the capacitor 210 is used in a tuning circuit and the capacitance should remain at a similar value across the different semiconductor fabrication processes. Otherwise, other circuits that are affected by the capacitor 210 should be redesigned to achieve the same performance or the same circuit behavior. In one example, in a previous semiconductor fabrication process (or process) that used two metal plates, the capacitor 210 had only the middle metal plate connected to the signal net 102 and the bottom metal plate connected to signal net 104. When a third metal plate is made available, as shown in the illustrated implementation, this third metal plate, which is the top metal plate, is also connected to the signal net 102. Therefore, the additional metal plate is connected to a same signal net (e.g., signal net 102) as the closest electrode plate of the capacitor 210.

The capacitance of capacitor 210 includes the ratio of the overlap area of the middle metal plate and the bottom metal plate to the insulating distance 212. Similar to the capacitor 150, the dielectric constant of the dielectric material, such as oxide layer 120, between the two metal plates also affects the capacitance. In an implementation, the capacitor 210 has a slightly greater capacitance than the capacitor 160 (of FIG. 1) due to the electrical connection 140 between the top metal plate and the signal net 102.

Figure 3:
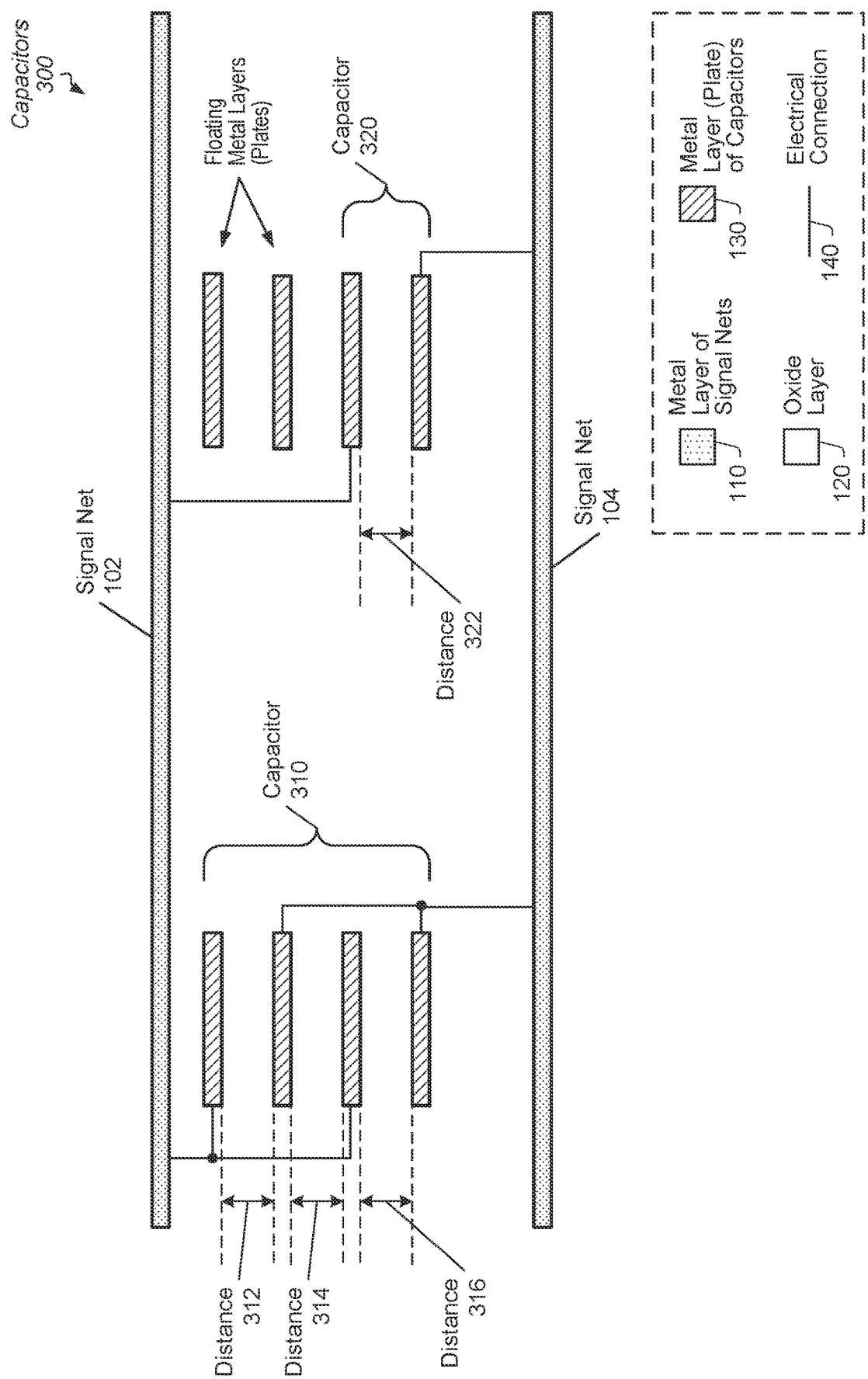
FIG. 3 is a generalized diagram of capacitors capable of maintaining a similar capacitance for design reuse across multiple semiconductor fabrication processes.

Turning now to FIG. 3, a generalized block diagram is shown of capacitors 300 of an integrated circuit capable of maintaining a similar capacitance for design reuse across multiple semiconductor fabrication processes. Signals and materials described earlier are numbered identically. The capacitors 300 includes the capacitor 310 and the capacitor 320. Here, in this example, the semiconductor fabrication process supports forming four metal plates between the two signal nets 102 and 104. The capacitor 310 uses no floating nets among the metal plates, whereas, the capacitor 320 uses two floating plates above its top electrode plate.

The equivalent capacitance of capacitor 310 is a sum of the capacitances of the three capacitances that use the insulating distances 312, 314 and 316. These three capacitances of the capacitor 310 are connected in a parallel configuration. The first capacitance includes the ratio of an overlap area to the insulating distance 312. The overlap area includes the overlap area of the top metal plate adjacent to signal net 102 and the metal plate adjacent to the top metal plate. The second capacitance includes the ratio of an overlap area to the insulating distance 314. This overlap area includes the overlap area of the second metal plate from the top and the third metal plate from the top, which are the two metal plates separated by the insulating distance (thickness) 314. The third capacitance is determined in a similar manner using the insulating distances (thickness) 316.

The capacitance of capacitor 320 includes the ratio of the overlap area of the middle metal plate and the bottom metal plate to the insulating distance 322. Similar to the capacitor 310, the dielectric constant of the dielectric material, such as oxide layer 120, between any two metal plates also affects the capacitance. Although the capacitors 310 and 320 are shown relatively close to one another, it is possible that these capacitors are in different regions of the integrated circuit that use the signal nets 102 and 104. In other implementations, the capacitors 310 and 320 do not share the signal nets 102 and 104. The capacitors 310 and 320 are shown sharing the signal nets 102 and 104 for ease of illustration.

In an example, the capacitor 310 is used as a decoupling capacitor, so an increase in the equivalent capacitance across different semiconductor fabrication processes is tolerated and improves circuit behavior. However, the capacitor 320 is used in a tuning circuit and the capacitance should remain at a similar value across the different semiconductor fabrication processes. Otherwise, other circuits that are affected by the capacitor 320 should be redesigned to achieve the same performance or the same circuit behavior. Therefore, as the number of metal plates between the signal nets 102 and 104 increase across different semiconductor fabrication processes, the capacitor 310 uses the additional metal plates as electrode plates. In contrast, the additional metal plates are used as floating plates for the capacitor 320.

Figure 4:
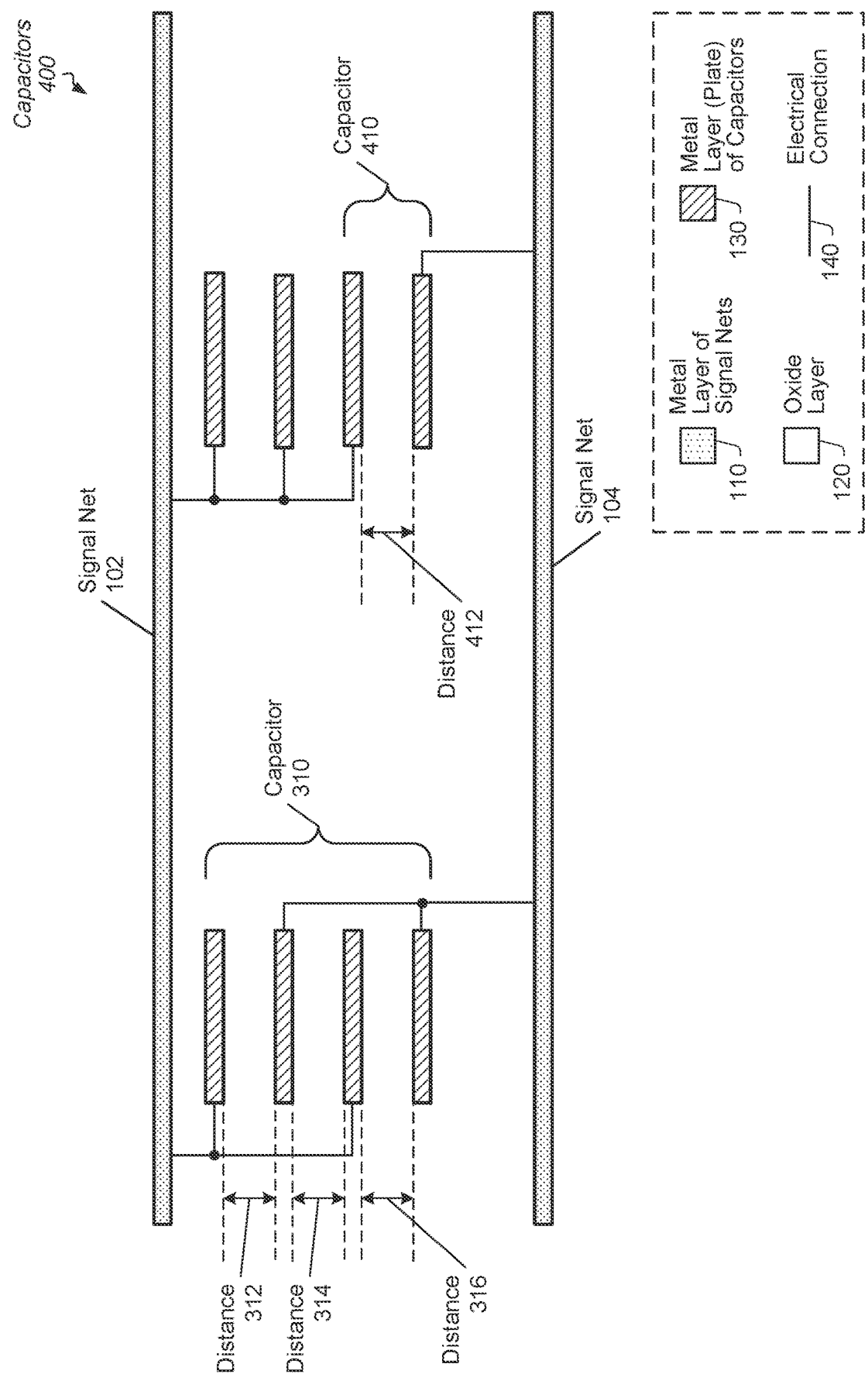
FIG. 4 is a generalized diagram of capacitors capable of maintaining a similar capacitance for design reuse across multiple semiconductor fabrication processes.

Turning now to FIG. 4, a generalized block diagram is shown of capacitors 400 of an integrated circuit capable of maintaining a similar capacitance for design reuse across multiple semiconductor fabrication processes. Signals and materials described earlier are numbered identically. The capacitors 400 includes the capacitor 310 and the capacitor 410. Here, in this example, the semiconductor fabrication process supports forming four metal plates between the two signal nets 102 and 104. Similar to the capacitor 310, the capacitor 410 includes four metal plates between the two signal nets 102 and 104.

Similar to the capacitor 310, the capacitor 410 includes four metal plates between the two signal nets 102 and 104. The capacitor 410 uses each of the three metal plates as electrode metal plates. The top three metal plates of the capacitor 410 are connected to the signal net 102. The bottom metal plate of capacitor 410 is connected to the signal net 104. In some designs, the capacitor 410 is used in a tuning circuit and the capacitance should remain at a similar value across the different semiconductor fabrication processes. When additional metal plates are made available by a process, these additional metal plates are also connected to the signal net 102. Therefore, the additional metal plates are connected to a same signal net (e.g., signal net 102) as the closest electrode plate of the capacitor 410.

The capacitance of capacitor 410 includes the ratio of an overlap area to the insulating distance 212. The overlap area includes the overlap area of the third metal plate from the top and the bottom metal plate. In an implementation, the capacitor 410 has a slightly greater capacitance than the capacitor 320 (of FIG. 3) due to the electrical connection 140 between the top metal plates and the signal net 102.

Figure 5:
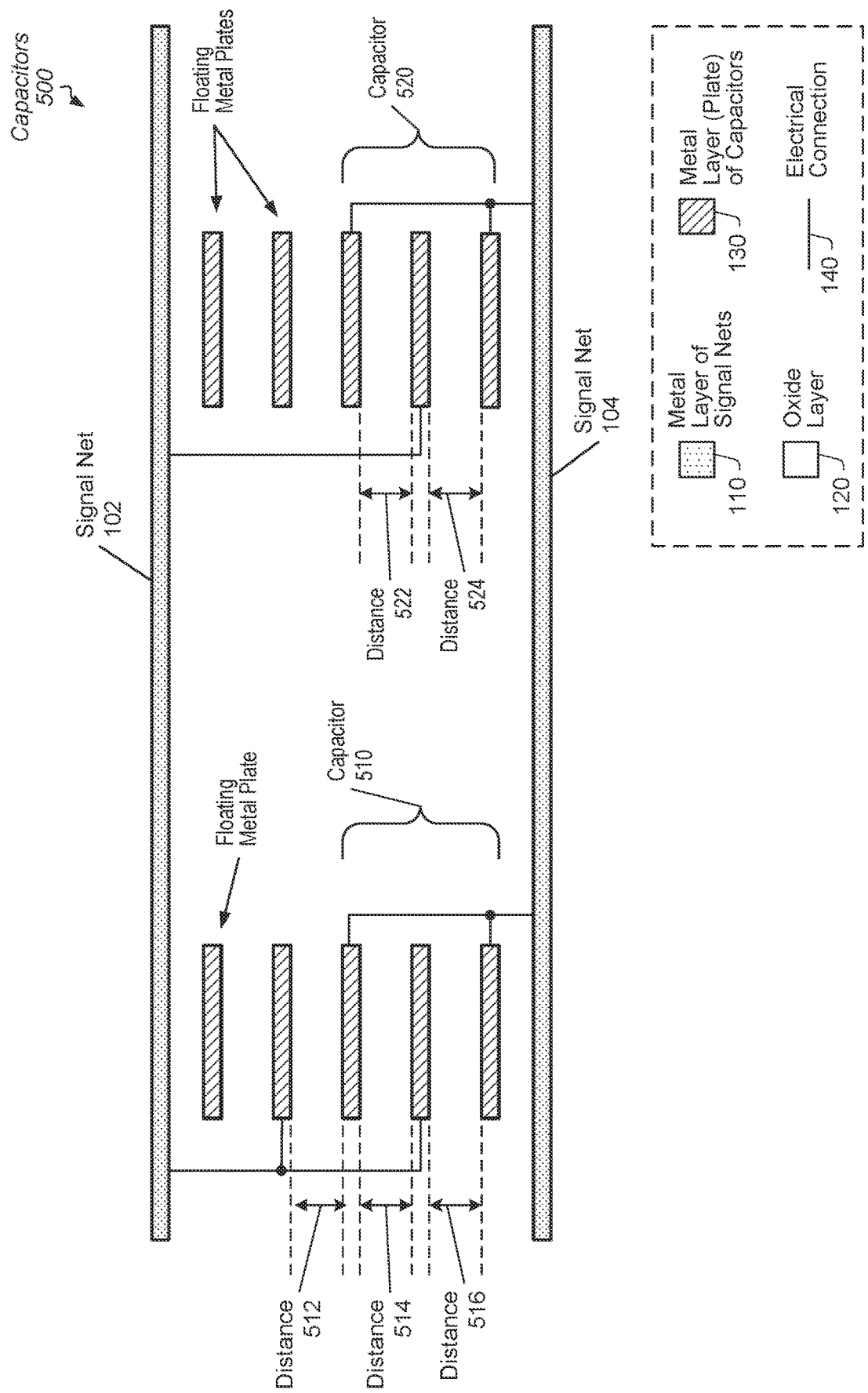
FIG. 5 is a generalized diagram of capacitors capable of maintaining a similar capacitance for design reuse across multiple semiconductor fabrication processes.

Referring to FIG. 5, a generalized block diagram is shown of capacitors 500 of an integrated circuit capable of maintaining a similar capacitance for design reuse across multiple semiconductor fabrication processes. Signals and materials described earlier are numbered identically. The capacitors 500 includes the capacitor 510 and the capacitor 520. In this example, the semiconductor fabrication process supports forming five metal plates between the two signal nets 102 and 104. Each of the capacitors 510 and 520 includes at least one floating metal plate.

The equivalent capacitance of capacitor 510 is a sum of the capacitances of the three capacitances that use the insulating distances 512, 514 and 516. These three capacitances of the capacitor 510 are connected in a parallel configuration. Similarly, the equivalent capacitance of capacitor 520 is a sum of the capacitances of the three capacitances that use the insulating distances 522 and 524. These two capacitances of the capacitor 520 are connected in a parallel configuration. When additional metal plates are made available by a process, some of these additional metal plates are formed as floating metal plates.

In one example, when a fourth metal plate is made available, the capacitor 510 has its capacitances increased by having the additional fourth metal plate connected to the signal net 102. In contrast, the capacitor 520 has its capacitance remain relatively the same by having the additional fourth metal plate formed as a floating plate. When a fifth metal plate is made available, the capacitor 510 has already reached a maximum capacitance for its design requirement. Therefore, the capacitor 510 has its maximum capacitance remain relatively the same by having the additional fifth metal plate formed as a floating plate. The capacitor 520 has its capacitance also remain relatively the same by having the additional fifth metal plate formed as a floating plate.

Turning to FIG. 6, a generalized block diagram of a method 600 for forming capacitors of an integrated circuit capable of maintaining a similar capacitance for design reuse across multiple semiconductor fabrication processes is shown. For purposes of discussion, the steps in this implementation are shown in sequential order. However, in other implementations some steps occur in a different order than shown, some steps are performed concurrently, some steps are combined with other steps, and some steps are absent. Typically, an on-die capacitor is formed between two signal nets. In some implementations, the two signal nets are power rails charged to two different voltage levels, a first signal net (or first power rail) is charged to a power supply reference voltage level, and a second signal net (or second power rail) is charged to a ground reference voltage level. In other implementations, the two signal nets are two different control signals or two different data signals used by the on-die integrated circuit. In one example, the first signal net is a metal four (M4) layer and the second signal net is a metal five (M5) layer. In one example, the first signal net is equivalent to the signal net 104 and the second signal net is equivalent to the signal net 102 (of FIG. 1-5). One or more insulating dielectric layers are formed between the two metal layers used for the first signal net and the second signal net. These one or more insulating dielectric layers include at least one inter-level dielectric (ILD). A semiconductor fabrication process (or process) forms, in an integrated circuit, the first signal net that uses an on-die capacitor with another signal net (block 602).

To form the first signal net, the process forms a metal layer on top of an oxide layer, such as the inter-level dielectric (ILD). The ILD is used to insulate metal layers, which are used for interconnects. In some implementations, the ILD is silicon dioxide. In other implementations, the ILD is one of a variety of low-k dielectrics containing carbon or fluorine. The low-k dielectrics provide a lower capacitance between the metal layers, and thus, reduce performance loss, power consumption, and cross talk between interconnect routes. A chemical mechanical planarization (CMP) step is used to remove unwanted ILD and to polish the remaining ILD. The CMP step achieves a near-perfect flat and smooth surface upon which further layers are built. Following, the process deposits the metal layer to be used as the first signal net. The metal layer is one of a variety of conductive materials such as copper, a mixture of copper and aluminum, and so on.

In some implementations, the process uses a dual damascene process to form the metal layer of the first signal net, whereas, in other implementations, the process uses a single damascene process. These and other techniques are contemplated. When the process uses copper for the first signal net, the process deposits a liner on the ILD before forming the metal layer. The liner uses a tantalum (Ta) based barrier material to prevent the copper from diffusing into the ILD and to act as an adhesion layer for the copper. Next, the process deposits a thin copper seed layer by physical vapor diffusion (PVD) followed by electroplating of copper. Afterward, the process polishes the excess copper metal and deposits a capping layer typically SiN (silicon mononitride). The process forms an additional oxide layer on top of the first signal net of a controlled thickness. In various implementations, the thickness of the oxide layer on top of the first signal net is at least an order of magnitude greater than a thickness of a thin gate silicon dioxide layer formed for active devices such as transistors. The process deposits the oxide layer using a combination of gasses such as dichlorosilane or silane with oxygen precursors, such as oxygen and nitrous oxide, typically at pressures from a few millitorr to a few torr.

The process forms a first metal layer to be used as a first plate of the on-die capacitor (block 604). The process uses one of a variety of conductive materials and methods to form the first metal layer as described earlier. In some implementations, the process uses a same conductive material for the first metal layer as used for the first signal net, whereas, in other implementations, the first signal net and the first metal layer use different conductive materials. For example, in some implementations, the first metal layer is one of tantalum nitride (TaN) and titanium nitride (TiN) in contrast to copper or a copper and aluminum mixture. In such implementations, the process forms the first metal layer using atomic layer deposition (ALD), or physical vapor deposition (PVD) such as a sputter technique.

The process forms a first dielectric layer adjacent to the first metal layer (block 606). In an implementation, the process uses an atomic layer deposition to form a relatively high-K oxide dielectric on the first metal layer. The process forms a second metal layer adjacent to the first dielectric layer creating a metal-insulator-metal (MIM) capacitor of the integrated circuit between the first metal layer and the second metal layer (block 608). The process forms (deposits) a second dielectric layer adjacent to the second metal layer (block 610). In some implementations, the process uses a same conductive material for the second metal layer as used for the first metal layer, whereas, in other implementations, the first metal layer and the second metal layer use different conductive materials. Similarly, in some implementations, the process uses a same insulating material for the second dielectric layer as used for the first dielectric layer, whereas, in other implementations, the first dielectric layer and the second dielectric layer use different insulating materials.

The process forms a third metal layer as a floating plate adjacent to the second dielectric layer (block 612). The third metal layer that is used as a floating plate has no connection to a voltage reference level used by the integrated circuit. The process uses similar techniques as described earlier to form the third metal layer. The process forms a second signal net that uses the on-die capacitor with the first signal net (block 614). The process uses similar techniques described earlier for forming the first signal net and its corresponding ILD. The process forms one of a variety of via types to physically connect the first signal net to the first metal layer, and to physically connect the second metal layer to the second signal net while bypassing the third metal layer. Therefore, each of the first metal layer and the second metal layer receives a respective voltage reference level applied to the first signal net and the second signal net (block 616).

If a potential is not applied to an input node of the integrated circuit ("no" branch of the conditional block 618), then the integrated circuit waits for power up (block 620). However, if a potential is applied to the input node of the integrated circuit ("yes" branch of the conditional block 618), then the circuitry of the integrated circuit conveys a current from the input node to an output node of the integrated circuit while charging the MIM capacitor (block 622).

Figure 7:
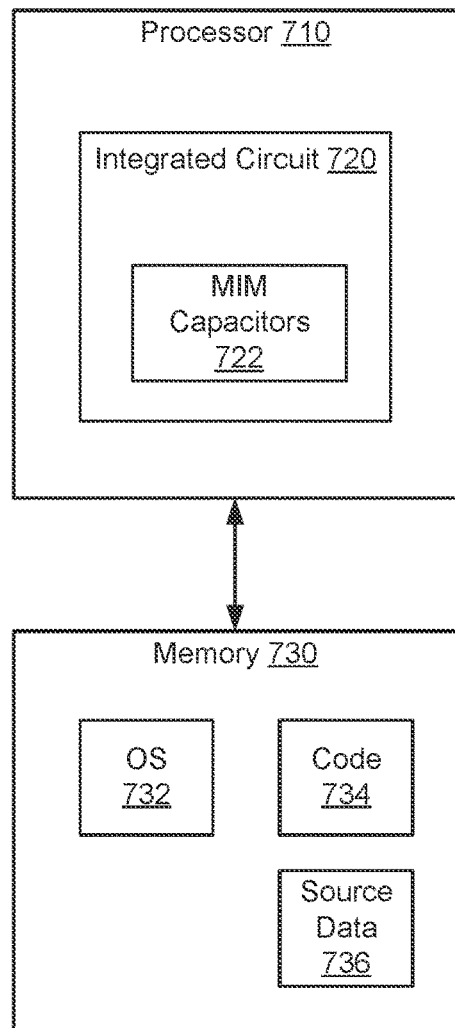
FIG. 7 is a generalized diagram of computing system with capacitors capable of maintaining a similar capacitance for design reuse across multiple semiconductor fabrication processes.

Referring to FIG. 7, one implementation of a computing system 700 is shown. The computing system 700 includes the processor 710 and the memory 730. Interfaces, such as a memory controller, a bus or a communication fabric, one or more phased locked loops (PLLs) and other clock generation circuitry, a power management unit, and so forth, are not shown for ease of illustration. It is understood that in other implementations, the computing system 700 includes one or more of other processors of a same type or a different type than processor 710, one or more peripheral devices, a network interface, one or more other memory devices, and so forth. In some implementations, the functionality of the computing system 700 is incorporated on a system on chip (SoC). In other implementations, the functionality of the computing system 700 is incorporated on a peripheral card inserted in a motherboard. The computing system 700 is used in any of a variety of computing devices such as a server computer, a desktop computer, a tablet computer, a laptop, a smartphone, a smartwatch, a gaming console, a personal assistant device, and so forth.

The processor 710 includes hardware such as circuitry. For example, the processor 710 includes at least one integrated circuit 720, which utilizes MIM capacitors 722. The integrated circuit 720 uses the MIM capacitors 722 for a variety of applications such as decoupling two signal nets from one another, smoothing or stabilizing the current and voltage output of power supplies and voltage regulators, adjusting frequency tuning circuitry, reconstructing receiving signals from transmission lines, and so on. Other examples of applications that use the MIM capacitors 722 are oscillators and phase-shift networks in radio frequency (RF) integrated circuits, bypass capacitors near active devices in microprocessors to limit the parasitic inductance, memory cell data storage in dynamic RAM, and so on. The MIM capacitors 722 are capable of maintaining a similar capacitance for design reuse across multiple semiconductor fabrication processes. For example, one or more of the MIM capacitors 722 instantiated in the integrated circuit 720 use configurations as shown earlier for capacitors 100-400 (of FIGS. 1-4).

In various implementations, the processor 710 includes one or more processing units. In some implementations, each of the processing units includes one or more processor cores capable of general-purpose data processing, and an associated cache memory subsystem. In such an implementation, the processor 710 is a central processing unit (CPU). In another implementation, the processing cores are compute units, each with a highly parallel data microarchitecture with multiple parallel execution lanes and an associated data storage buffer. In such an implementation, the processor 710 is a graphics processing unit (GPU), a digital signal processor (DSP), or other.

In some implementations, the memory 730 includes one or more of a hard disk drive, a solid-state disk, other types of flash memory, a portable solid-state drive, a tape drive and so on. The memory 730 stores an operating system (OS) 732, one or more applications represented by code 734, and at least source data 736. Memory 730 is also capable of storing intermediate result data and final result data generated by the processor 710 when executing a particular application of code 734. Although a single operating system 732 and a single instance of code 734 and source data 736 are shown, in other implementations, another number of these software components are stored in memory 730. The operating system 732 includes instructions for initiating the boot up of the processor 710, assigning tasks to hardware circuitry, managing resources of the computing system 700 and hosting one or more virtual environments.

Each of the processor 710 and the memory 730 includes an interface unit for communicating with one another as well as any other hardware components included in the computing system 700. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
   a metal-insulator-metal (MIM) capacitor comprising a first metal layer separated from a second metal layer by an insulating distance equal to a thickness of a first dielectric layer between the first metal layer and the second metal layer;
   a second dielectric layer adjacent to the second metal layer; and
   a third metal layer adjacent to the second dielectric layer; and
   wherein:
      each of the first metal layer and the second metal layer is connected to a respective voltage reference level; and
      the third metal layer has no connection to a voltage reference level used by the first metal layer.

2. The integrated circuit as recited in claim 1, wherein the third metal layer is a floating net with no connection to a voltage reference level used by the integrated circuit.

3. The integrated circuit as recited in claim 2, further comprising one or more metal layers in addition to the third metal layer between the third metal layer and a signal net that are floating with no connection to a voltage reference level used by the integrated circuit.

4. The integrated circuit as recited in claim 1, wherein the third metal layer is connected to a voltage reference level used by the second metal layer.

5. The integrated circuit as recited in claim 4, further comprising one or more metal layers in addition to the third metal layer between the third metal layer and a signal net that are connected to the voltage reference level used by the second metal layer.

6. The integrated circuit as recited in claim 1, wherein:
   the first metal layer is connected to a first signal net via a fourth metal layer; and
   the second metal layer is connected to a second signal net via a fifth metal layer.

7. The integrated circuit as recited in claim 1, wherein each of the first dielectric layer and the second dielectric layer comprises an oxide layer surrounding the first metal layer, the second metal layer, and the third metal layer.

8. A computing system comprising:
a memory configured to store instructions of one or more tasks and source data to be processed by the one or more tasks;
an integrated circuit configured to execute the instructions using the source data, wherein the integrated circuit comprises one or more metal-insulator-metal (MIM) capacitors, each comprising:
   a first metal layer;
   a first dielectric layer adjacent to the first metal layer;
   a second metal layer adjacent to the first dielectric layer, wherein a metal-insulator-metal (MIM) capacitor is formed by the first metal layer separated from the second metal layer by an insulating distance equal to a thickness of the first dielectric layer between the first metal layer and the second metal layer;
   a second dielectric layer adjacent to the second metal layer; and
   a third metal layer adjacent to the second dielectric layer; and
wherein:
   each of the first metal layer and the second metal layer is connected to a respective voltage reference level; and
   the third metal layer has no connection to a voltage reference level used by the first metal layer.

9. The computing system as recited in claim 8, wherein the third metal layer is a floating net with no connection to a voltage reference level used by the integrated circuit.

10. The computing system as recited in claim 9, wherein the integrated circuit further comprises one or more metal layers in addition to the third metal layer between the third metal layer and a signal net that are floating with no connection to a voltage reference level used by the integrated circuit.

11. The computing system as recited in claim 8, wherein the third metal layer is connected to a voltage reference level used by the second metal layer.

12. The computing system as recited in claim 11, wherein the integrated circuit further comprises one or more metal layers in addition to the third metal layer between the third metal layer and a signal net that are connected to the voltage reference level used by the second metal layer.

13. The computing system as recited in claim 8, wherein:
   the first metal layer is connected to a first signal net via a fourth metal layer; and
   the second metal layer is connected to a second signal net via a fifth metal layer.

* * * * *